(12) United States Patent
Shimizu et al.

(10) Patent No.: US 9,059,103 B2
(45) Date of Patent: Jun. 16, 2015

(54) PROCESSING METHOD AND STORAGE MEDIUM

(75) Inventors: Wataru Shimizu, Miyagi (JP); Kiyoshi Maeda, Miyagi (JP); Toshifumi Nagaiwa, Miyagi (JP)

(73) Assignee: TOKYO ELECTRON LIMITED (JP)

( * ) Notice: Subject to any disclaimer, the term of this patent is extended or adjusted under 35 U.S.C. 154(b) by 0 days.

(21) Appl. No.: 13/428,230

(22) Filed: Mar. 23, 2012

(65) Prior Publication Data

US 2012/0244720 A1    Sep. 27, 2012

Related U.S. Application Data

(60) Provisional application No. 61/472,657, filed on Apr. 7, 2011.

(30) Foreign Application Priority Data

Mar. 25, 2011  (JP) ................................. 2011-068695

(51) Int. Cl.
| | |
|---|---|
| *H01L 21/31* | (2006.01) |
| *H01L 21/3105* | (2006.01) |
| *H01L 21/768* | (2006.01) |
| *H01L 21/02* | (2006.01) |
| *H01L 21/67* | (2006.01) |

(52) U.S. Cl.
CPC ....... *H01L 21/3105* (2013.01); *H01L 21/02126* (2013.01); *H01L 21/02203* (2013.01); *H01L 21/02337* (2013.01); *H01L 21/67109* (2013.01); *H01L 21/76814* (2013.01); *H01L 21/76826* (2013.01); *H01L 21/76831* (2013.01)

(58) Field of Classification Search
CPC ..................... H01L 21/3105; H01L 21/76814; H01L 21/76826; H01L 21/76831; H01L 21/02126; H01L 21/02203; H01L 21/02337; H01L 21/67109
USPC ......................................................... 438/778
See application file for complete search history.

(56) References Cited

U.S. PATENT DOCUMENTS

| | | | | |
|---|---|---|---|---|
| 2009/0170314 | A1* | 7/2009 | Morinaga et al. | 438/672 |
| 2011/0117678 | A1* | 5/2011 | Varadarajan et al. | 438/4 |
| 2011/0143547 | A1* | 6/2011 | Nakamura | 438/710 |

FOREIGN PATENT DOCUMENTS

| | | |
|---|---|---|
| CN | 101901781 | 12/2010 |
| JP | 2002-083869 | 3/2002 |
| JP | 2006-049798 | 2/2006 |
| JP | 2009016446 | 1/2009 |
| JP | 2010103151 | 5/2010 |

* cited by examiner

*Primary Examiner* — Shaun Campbell
(74) *Attorney, Agent, or Firm* — Cantor Colburn LLP (57) ABSTRACT

Disclosed is a processing method that removes moisture in a low permittivity film formed on a substrate to be processed which has a damaged layer on the surface thereof while maintaining the specific permittivity or a leakage current value low when the film is subjected to a recovery processing. The method for the recovery processing includes applying, on the damaged layer of the low permittivity film, a first processing gas whose molecules are small sufficient to permeate the inside of the damaged layer of the low permittivity film and which is able to remove the moisture in the damaged layer and a second processing gas which forms a hydrophobic dense reformatted layer on the surface of the damaged layer, thereby allowing the first processing gas and the second processing gas to react with the damaged layer.

16 Claims, 6 Drawing Sheets

PROCESSING METHOD AND STORAGE MEDIUM

CROSS-REFERENCE TO RELATED APPLICATIONS

This application is based on and claims priority from Japanese Patent Application No. 2011-068695, filed on Mar. 25, 2011, with the Japanese Patent Office, the disclosure of which is incorporated herein in its entirety by reference. Also, this application claims the benefit of U.S. Provisional Application No. 61/472,657 filed on Apr. 7, 2011, with the United States Patent and Trademark Office, the disclosure of which is incorporated herein in its entirety by reference.

TECHNICAL FIELD

The present disclosure relates to a processing method for recovering damage of a low dielectric constant film, which is used as, for example, an interlayer insulating film, caused by an etching process or an ashing process, and a recording medium having a program, which executes the processing method, recorded therein.

BACKGROUND

Recently, in response to demands for the speed up of semiconductor devices, miniaturization and high-integration of wiring patterns, it is required to reduce the capacity between wiring lines and improve conductivity and electromigration resistance of the wiring line. Accordingly, as wiring materials, copper (Cu) having higher conductivity and better electromigration resistance than aluminum (Al) or tungsten (W) of the related art is used. As a technology that forms a Cu wiring line, a damascene method that forms a wiring groove or connecting hole in the interlayer insulating film in advance, and then buries the copper therein is widely used (see, for example, Japanese Patent Application Laid-Open No. 2002-083869).

In the meantime, as the semiconductor devices become miniaturized, a parasitic capacity of the interlayer insulating film has been an important factor for improving the performance of the wiring line and a low permittivity film (low-k film) formed of a low permittivity material is used as the interlayer insulating film. As the material constituting the low-k film, a material having an alkyl group such as a methyl group as a terminal group is generally used.

However, in the damascene process in the related art as above, the low-k film is damaged when performing an etching process or a resist film removing (ashing) process. The damage may cause the increase in a specific permittivity or the leakage current value of the low-k film, which impairs the effect of the usage of the low-k film as the interlayer insulating film.

As a technology that recovers the above-mentioned damage, Japanese Patent Application Laid-Open No. 2006-049798 suggests a method that recovers the damage using a silylating agent such as N-trimethylsilyldimethylamine (TMSDMA) after etching or removing a resist film. This method reforms a surface of the damaged layer whose terminal group is changed to an —OH group due to the damage using a processing gas having a methyl group such as a silylating agent to make the methyl group or a group containing the methyl group as the terminal group.

SUMMARY

An exemplary embodiment of the present disclosure provides a processing method for performing a recovery processing on a low permittivity film that is formed on a substrate to be processed and has a damaged layer on the surface thereof, the method including applying, on the damaged layer of the low permittivity film, a first processing gas whose molecule is small sufficient to permeate the inside of the damaged layer of the low permittivity film and which is able to remove moisture in the damaged layer, and a second processing gas which forms a hydrophobic dense reformatted layer on the surface of the damaged layer, thereby allowing the first processing gas and the second processing gas to react with the damaged layer.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

A porous low-k film having a plurality of pores whose specific permittivity is much low (hereinafter, referred to as a porous low-k film) has been widely used recently as the low-k film. When the porous low-k film is damaged, not only the surface of the damaged layer, but also the inside pores become hydrophilic so that moisture is adsorbed even in the inside pores. In this status, when the silylating agent such as N-trimethylsilyldimethylamine (TMSDMA) is used to perform the recovery processing, the surface of the low-k film is reformed to be densificated, but the moisture adsorbed in the inside pores is confined therein. Accordingly, when the confined moisture is exhausted to the outside by a predetermined factor during a device forming process, it adversely affects so that a barrier metal or a wiring line is oxidized.

The present disclosure has been made in an effort to provide a processing method which is able to remove moisture in a low permittivity film while maintaining the specific permittivity or leakage current value low, when the film is subjected to a recovery processing.

The present disclosure provides a storage medium that stores a program for executing the processing method.

An exemplary embodiment of the present disclosure provides a processing method for performing a recovery processing on a low permittivity film that is formed on a substrate to be processed and has a damaged layer on the surface thereof, the method including applying, on the damaged layer of the low permittivity film, a first processing gas whose molecule is small sufficient to permeate the inside of the damaged layer of the low permittivity film and which is able to remove moisture in the damaged layer, and a second processing gas which forms a hydrophobic dense reformed layer on the surface of the damaged layer, thereby allowing the first processing gas and the second processing gas to react with the damaged layer.

In the processing method, the first processing gas and the second processing gas are applied to the damaged layer in a mixture state. After processing with the first processing gas, processing with the second processing gas may be performed.

The molecule of the first processing gas may permeate the inside of the damaged layer to cause a dehydration reaction. The second processing gas may contain Si and/or C, and may recover a surface of the damaged layer using a methyl group or forms a dense film on the surface of the damaged layer.

DMC may be used as the first processing gas, and TMS-DMA may be used as the second processing gas.

Another exemplary embodiment of the present disclosure provides a non-transitory computer readable recording medium storing a computer executable program that, when executed, causes a computer to control a processing apparatus to perform a processing method for performing a recovery processing on a low permittivity film that is formed on a substrate to be processed and has a damaged layer on the surface thereof, the method including applying, on the damaged layer of the low permittivity film, a first processing gas whose molecule is small sufficient to permeate the inside of the damaged layer of the low permittivity film and which is able to remove moisture in the damaged layer, and a second processing gas which forms a hydrophobic dense reformed layer on the surface of the damaged layer, thereby allowing the first processing gas and the second processing gas to react with the damaged layer.

According to the exemplary embodiments of the present disclosure, since the first processing gas enters the damaged layer to remove moisture therein and the second processing gas forms a hydrophobic and dense reformed layer on a surface of the damaged layer, the damage on the surface of the damaged layer is recovered to lower the specific permittivity or the leakage current value. At the same time, new moisture does not enter the film due to the hydrophobic and dense reformed layer, so that the moisture in the low permittivity layer is maintained low.

Hereinafter, exemplary embodiment of the present disclosure will be described with reference to accompanying drawings.

<Apparatus for Performing a Recovery Processing>

Figure 1:
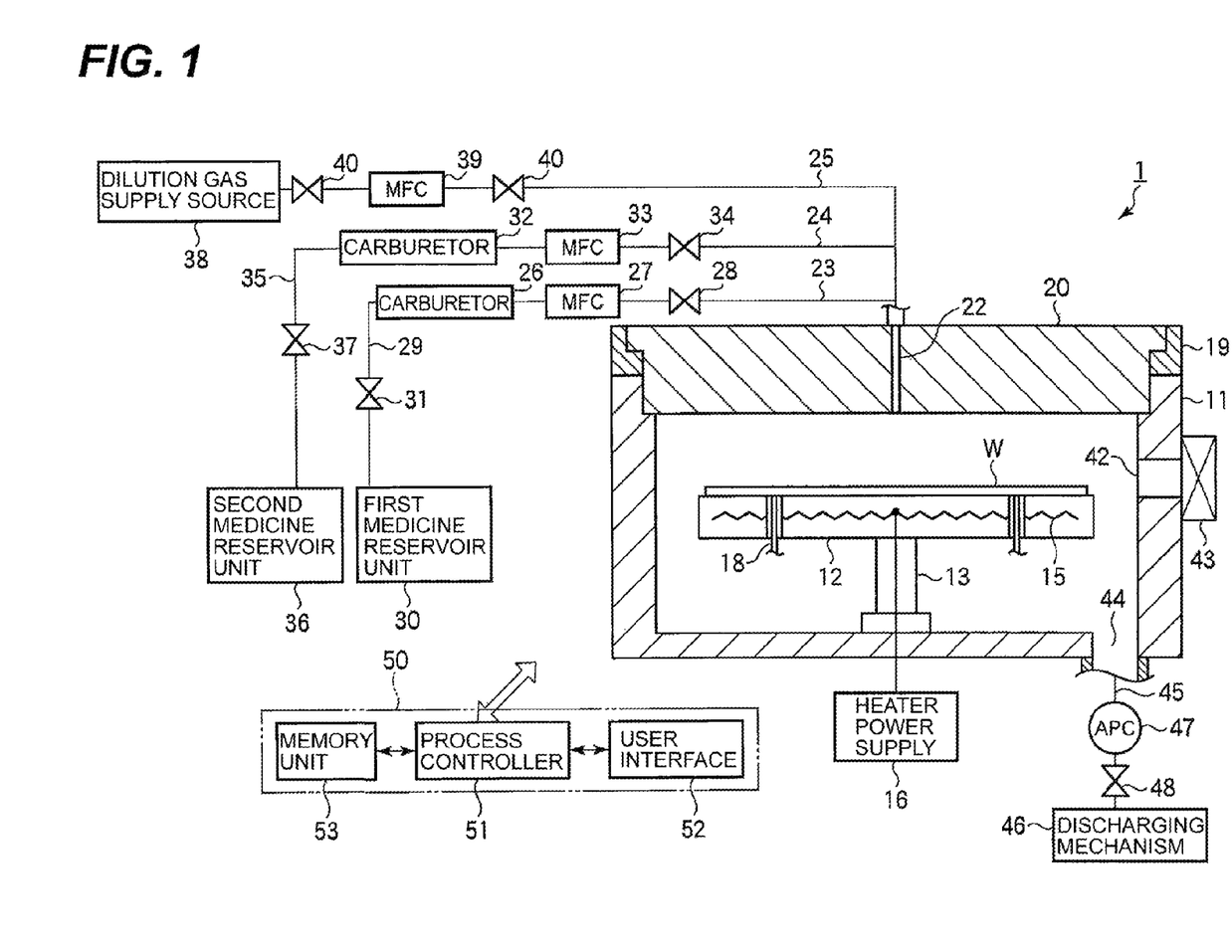
FIG. 1 is a cross-sectional view illustrating an example of a processing apparatus that performs a method according to an exemplary embodiment of the present disclosure.

FIG. 1 is a cross-sectional view illustrating an example of a processing apparatus that performs a method according to an exemplary embodiment of the present disclosure.

A processing apparatus 1 is an apparatus that recovers damage of a porous low-k film formed on a wafer W that is a substrate to be processed. Processing apparatus 1 includes a chamber 11 that accommodates wafer W. Inside chamber 11, a loading table 12 that horizontally supports wafer W which is a substrate to be processed is provided. Loading table 12 is supported by a cylindrical supporting member 13 that extends from the center of the bottom of chamber 11 to the upper side thereof. A resistance-type heater 15 is buried in loading table 11, and electric current is supplied from a heater power supply 16 to heater 15 to heat loading table 12, and further heat wafer W on loading table 12 using the heat. A thermocouple (not shown) is inserted in loading table 12 to control the temperature of wafer W to a predetermined value. On loading table 12, three wafer supporting pins 18 (only two of them are shown) that support and raise wafer W are provided so as to protrude or dent with respect to a surface of loading table 12.

The upper portion of chamber 11 is opened and a ring-shaped lead 19 is provided along an upper end of chamber 11. A gas introducing head 20 that introduces a processing gas or dilution gas is supported by lead 19 and gas introducing head 20 is air-tightly sealed to chamber 11 by sealing member (not shown). A gas supplying pipe 21 is connected to the center of the upper portion of gas introducing head 20. A gas flow channel 22 connected to gas supplying pipe 21 is formed in gas introducing head 20. A first processing gas supplying pipe 23, a second processing gas supplying pipe 24, and a dilution gas supplying pipe 25 are connected to gas supplying pipe 21.

A carburetor 26, a mass flow controller 27 that controls a flow rate of the processing gas, and a valve 28 are interposed in first processing gas supplying pipe 23. A first chemical liquid pipe 29 that supplies a first processing gas and extends from a first chemical liquid reservoir unit 30 that stores a first chemical liquid is connected to carburetor 26, and a valve 31 is provided in first chemical liquid pipe 29. The first chemical liquid is supplied from first chemical liquid reservoir unit 30 to carburetor 26 through first chemical liquid pipe 29 by conveying gas, and then, the first processing gas that is generated by vaporization in carburetor 26 is supplied to first processing gas supplying pipe 23.

A carburetor 32, a mass flow controller 33 that controls a flow rate of the processing gas, and a valve 34 are interposed in second processing gas supplying pipe 24. A second chemical liquid pipe 35 that supplies a second processing gas and extends from a second chemical liquid reservoir unit 36 that stores a second chemical liquid is connected to carburetor 32, and a valve 37 is provided in second chemical liquid pipe 35. The second chemical liquid is supplied from second chemical liquid reservoir unit 36 to carburetor 32 through second chemical liquid pipe 35 by conveying gas, and then, the first processing gas that is generated by vaporization in carburetor 32 is supplied to second processing gas supplying pipe 24.

A dilution gas supply source 38 that supplies the dilution gas is connected to the other end of dilution gas supplying pipe 25. A mass flow controller 39 that controls a flow rate of the dilution gas and valves 40 before and after the controller are interposed in dilution gas supplying pipe 25. As for the dilution gas, $N_2$ gas may be used. Alternatively, rare gas such as Ar gas may be used as well for the dilution gas.

Molecule of the first processing gas is small sufficient to permeate inside the damaged layer of the porous low-k film, and the first processing gas has a function to cause, for example, a dehydration reaction inside the damaged layer to remove (fix) the moisture in the pores. Examples of the first processing gas include dimethyl carbonate (DMC) or diazomethane. As for the first processing gas, the molecule of the first processing gas may be smaller than the pore of the damaged layer, and may enter into the damaged layer to cause the dehydration reaction.

The second processing gas recovers (restores) the surface of the damaged layer of the porous low-k film damaged due to an etching process or an ashing process using, for example, a methyl group (—CH$_3$) to form a dense film on the surface of the porous low-k film. The second processing gas is a gas containing Si and/or C, and the examples thereof include a silylating agent such as N-trimethylsilyldimethylamine (TMSDMA), dimethylsilyldimethylamine (DMSDMA), 1,1,3,3-tetramethyldisilazane (TMDS), 1-trimethylsilylpyrole (TMSPyrole), N,O-bis(trimethylsilyl)trifluoroacetamide (BSTFA), bis(dimethylamino)dimethylsilane (BD-MADMS). When using the silylating agent, the damaged portion (Si—OH portion) of the surface of the film is substituted with Si—CH$_3$ to form a hydrophobic dense film.

A wafer carrying-in/out port 42 is provided on a side wall of chamber 11 and controlled so as to be opened or closed by a gate valve 43. When gate valve 43 is opened, wafer W is carried in or out between wafer carrying-in/out port 42 and a conveying chamber (not shown) which is adjacent to chamber 11, includes a conveying device, and is maintained in a vacuum state.

An exhausting port 44 is provided at the circumference around the bottom of chamber 11, and an exhausting pipe 45 is connected to exhausting port 44. An exhausting mechanism 46 including a vacuum pump is connected to exhausting pump 45. An automatic pressure control (APC) valve 47 and an opening/closing valve 48 are provided above exhausting mechanism 46 of exhausting pipe 45. Therefore, it is possible to control the inside of chamber 11 at predetermined pressure by exhausting the inside of chamber 11 via exhausting mechanism 46 while detecting the pressure in chamber 11 by a pressure sensor (not shown), and controlling the opening degree of automatic pressure control valve (APC) 47. When the pressure in chamber 11 during the processing becomes a predetermined value, the processing gas may be sealed off from opening/closing valve 48.

Processing apparatus 1 further includes a controller 50 that controls individual components of processing apparatus 1, and includes a process controller 51 having a microprocessor (computer) that actually controls the individual components. A keyboard that allows an operator to input a command in order to manage processing apparatus 1 or a user interface 52 including a display that visualizes and displays the operation status of processing apparatus 1 are connected to process controller 51. A control program that controls a control target of the components of processing apparatus 1, or a program that allows processing apparatus 1 to perform predetermined processing, that is, a memory unit 53 that stores a processing recipe are connected to process controller 51. The processing recipe is stored in a storage medium in memory unit 53. The storage medium may be a fixed medium such as a hard disc or a portable medium such as a CD-ROM, a DVD or a flash memory. The receipt may be appropriately transmitted from other device, for example, through a dedicated line. If necessary, a predetermined processing receipt is called out from memory unit 53 in response to a command from user interface 52 to be performed by process controller 51 so that predetermined processing is performed under the control of process controller 51.

<Exemplary Embodiment of a Recovery Processing>

Next, an exemplary embodiment of a processing method that recovers wafer W having a damaged porous low-k film by processing apparatus 1 having the above-mentioned configuration will be described.

Here, by a dual damascene method, the damage that is caused in the porous low-k film at the time of etching or ashing for forming a wiring groove or a connection hole is recovered by the first processing gas and the second processing gas.

As for the porous low-k film, methyl-hydrogen-silsesquioxane (MSQ) formed in a spin on dielectric (SOD) device, an SiOC-based film that is one of the inorganic insulating films formed by CVD (a film in which a methyl group (—CH$_3$) is introduced in a Si—O bond of an SiO$_2$ film in the related art to mix Si—CH$_3$ bond, and examples thereof includes black diamond (Applied Materials, Inc.), Coral (Novellus, Inc.) or Aurora (ASM Ltd.)) may be applied.

(First Exemplary Embodiment)

Figure 2:
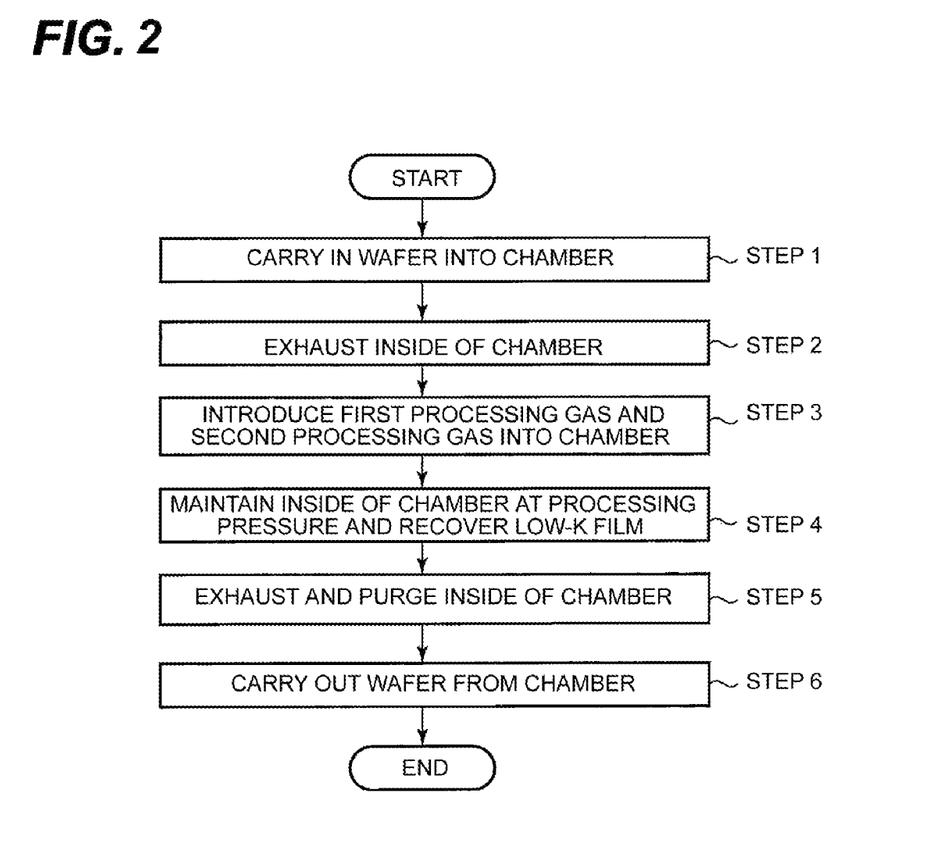
FIG. 2 is a flowchart illustrating a processing method according to a first exemplary embodiment.

FIG. 2 is a flowchart illustrating a processing method according to a first exemplary embodiment.

First, gate valve 43 is opened and wafer W having a porous low-k film damaged by an etching process or an ashing process is carried into chamber 11 through transfer port 42 to be displaced on loading table 12 heated at a predetermined temperature (step 1). Thereafter, the inside of the chamber 11 is exhausted to be in a vacuum state at a predetermined pressure (step 2).

Next, the first chemical liquid is supplied from first chemical liquid reservoir unit 30 to carburetor 26 through chemical liquid supplying pipe 29 by conveying gas, and the first processing gas such as DMC that is formed by vaporization in carburetor 26 is supplied to gas supplying pipe 21 through first processing gas supplying pipe 23. Simultaneously, the second chemical liquid is supplied from second chemical liquid reservoir unit 36 to carburetor 32 through chemical liquid supplying pipe 35 by conveying gas, and the second processing gas such as the TMSDMA that is formed by vaporization in carburetor 32 is supplied to gas supplying pipe 21 through second processing gas supplying pipe 24. These gases are introduced in chamber 11 through processing gas flow channel 22 of gas introducing head 20 (step 3).

In this case, together with the first processing gas and the second processing gas, a dilution gas such as an N$_2$ gas is introduced from dilution gas supply source 38 to chamber 11 through dilution gas supplying pipe 25, gas supplying pipe 21 and gas flow channel 22.

At step 3, a flow rate of the first processing gas may be 100 sccm to 2,000 sccm, a flow rate of the second processing gas may be 100 sccm to 2,000 sccm, and a flow rate of the dilution gas may be 0 sccm to 3,000 sccm. Based on the above-mentioned flow rates, a mixed chemical liquid in which a chemical liquid for the first processing gas and a chemical liquid for the second processing gas are mixed with a predetermined ratio may be used, and the dilution gas may be added thereto.

When the pressure of chamber 11 reaches a processing pressure, supplying of the first processing gas and the second processing gas is stopped, and the first processing gas and the second processing gas are sealed in chamber 11 so that the pressure of chamber 11 is maintained at the processing pressure and the low-k film is recovered (step 4). In this recovery processing, a temperature of wafer W may be 150° C. to 300° C. The pressure of chamber 11 in the recovery processing may be 667 Pa to 4,000 Pa (5 Torr to 30 Torr). The recovery processing time may be 10 sec to 420 sec.

After completing the recovery processing as described above, while exhausting mechanism 46 exhausts chamber 11, a dilution gas is introduced from dilution gas supply source 38 to chamber 11 to purge inside chamber 11 (step 5). Thereafter, gate valve 43 is opened to carry out a recovered wafer W from transfer port 42 (step 6).

(Second Exemplary Embodiment)

Figure 3:
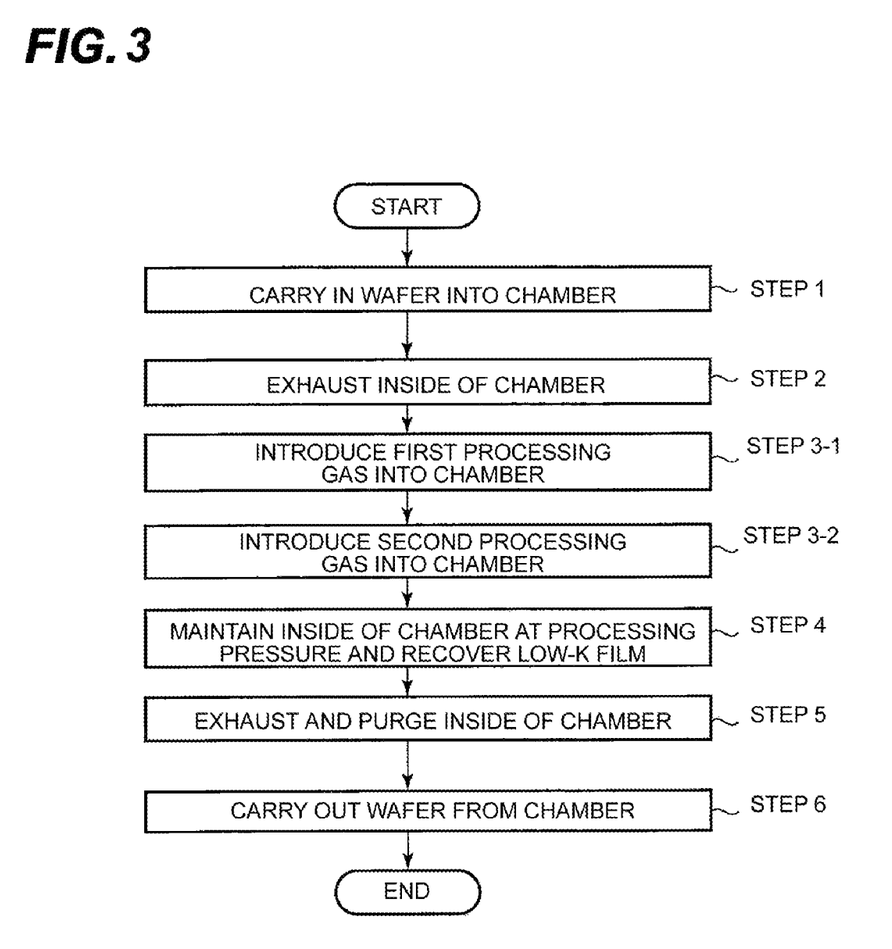
FIG. 3 is a flowchart illustrating a processing method according to a second exemplary embodiment.

FIG. 3 is a flowchart illustrating a processing method according to a second exemplary embodiment.

In this exemplary embodiment, similarly to the first exemplary embodiment, wafer W having a damaged porous low-k film is carried in to chamber 11 and displaced on loading table 12 heated at a predetermined temperature (step 1). Thereafter, chamber 11 is exhausted to be in a vacuum state at a predetermined pressure (step 2).

Next, the first chemical liquid is supplied from first chemical liquid reservoir unit 30 to carburetor 26 through chemical liquid supplying pipe 29 by conveying gas. And the first processing gas such as the DMC that is formed by vaporization in carburetor 26 is supplied to gas supplying pipe 21 through first processing gas supplying pipe 23 to be introduced in chamber 11 through processing gas flow channel 22 of gas introducing head 20 (step 3-1). In this case, the first processing gas and the dilution gas are simultaneously supplied. The flow rate of the first processing gas may be 100 sccm to 2,000 sccm, a flow rate of the dilution gas may be 0 sccm to 3,000 sccm, and the pressure of the chamber may be 400 Pa to 13,332 Pa (3 Torr to 100 Torr).

After performing step 3-1 for a predetermined period of time, supplying of the first processing gas is stopped. For example, while maintaining the pressure in chamber 11, the first processing gas is switched into a second processing gas. That is, the second chemical liquid is supplied from second chemical liquid reservoir unit 36 to carburetor 32 through chemical liquid supplying pipe 35 by conveying gas, and the second processing gas such as the TMSDMA that is formed by vaporization in carburetor 32 is supplied to gas supplying pipe 21 through second processing gas supplying pipe 24 to be introduced into chamber 11 through processing gas flow channel 22 of gas introducing head 20 (step 3-2). In this case, the second processing gas and the dilution gas are simultaneously supplied. The flow rate of the second processing gas may be 100 sccm to 2,000 sccm, and a flow rate of the dilution gas may be 0 sccm to 3,000 sccm. The second processing gas may be introduced after purging the first processing gas.

When the pressure of chamber 11 reaches a processing pressure, supplying of the second processing gas is stopped, and valve 48 is closed so that the second processing gas is sealed in chamber 11 and the pressure of chamber 11 is maintained at the processing pressure and the low-k film is recovered (step 4'). In this recovery processing, the temperature of wafer W may be 150° C. to 300° C. The pressure inside the chamber in the recovery processing may be 667 Pa to 4,000 Pa (5 Torr to 30 Torr). The recovery processing time may be 10 sec to 420 sec.

After completing the recovery processing as described above, similarly to the first exemplary embodiment, a purging process is performed in chamber 11 (step 5) and then wafer W completed with the recovery processing is carried out (step 6).

<Mechanism and Effect>

Figure 4:
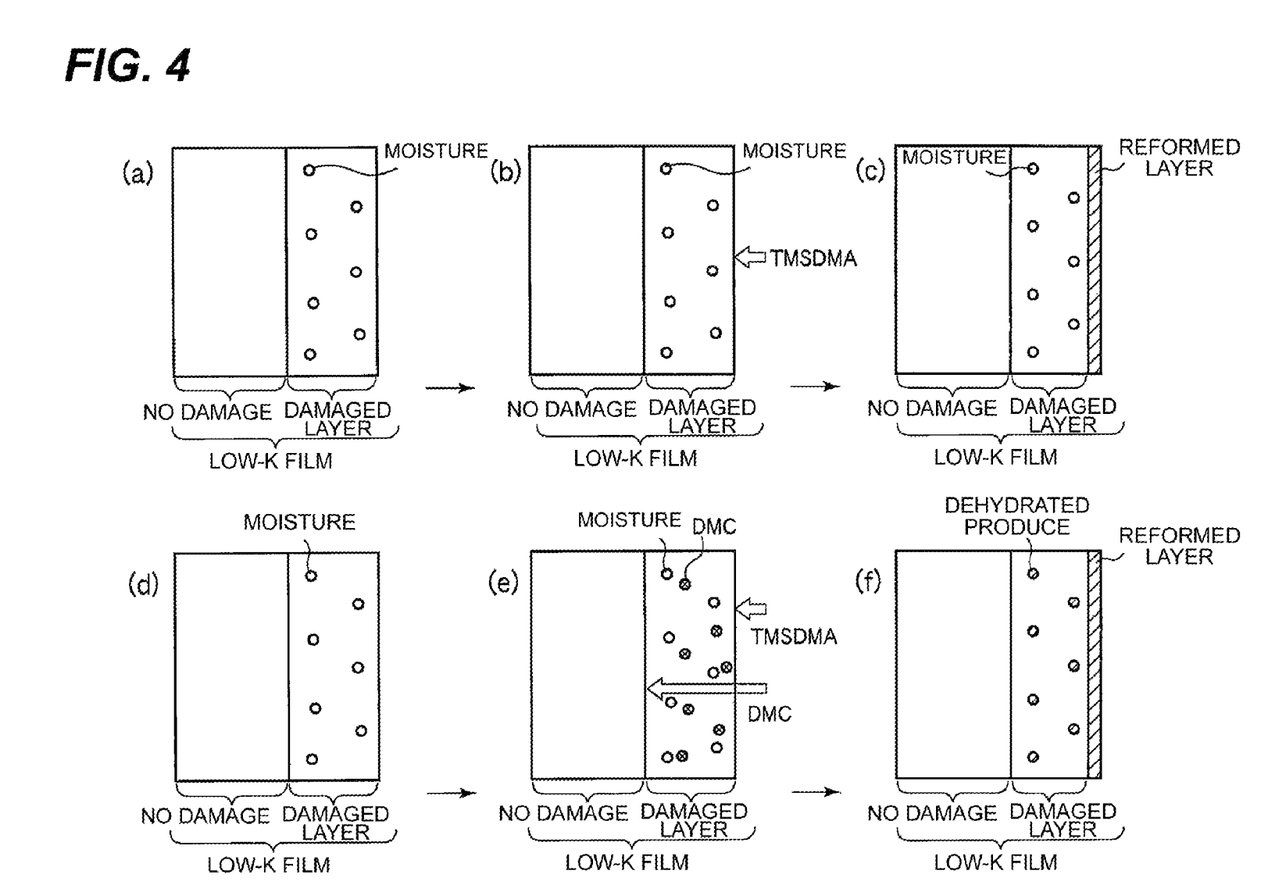
FIG. 4 is a pattern diagram illustrating models of a recovery processing in the related art and a recovery processing according to an exemplary embodiment of the present disclosure.

FIG. 4 is a pattern diagram illustrating models of the recovery processing in the related art and the recovery processing according to an exemplary embodiment of the present disclosure. As shown in FIG. 4A, when the porous low-k film is damaged by an etching process or an ashing process, the diameter of pores is changed from 1 nm to 2 nm into 2 nm or larger. The pores therein become hydrophilic so that moisture is adsorbed thereinto, and the damaged layer contains moisture. As shown in FIG. 4B, in this status, even though the TMSDMA that has been used in the related art is vaporized to be recovered, the molecules of the chemical liquid are too large to reach the inside of the damaged layer. Accordingly, as shown in FIG. 4C, a hydrophobic dense reformed layer is formed only on the surface. However, the inside of the damaged layer is in a hydrophilic state that is damaged so that the moisture is confined in the damaged layer by the dense reformed layer.

In contrast, in the first and second exemplary embodiments, as for the first processing gas, a gas whose molecules are small sufficient to permeate inside the damaged layer and which has a function to cause a dehydration reaction in the pores to remove (fix) the moisture inside the pores, for example, DMC is used. As for the second processing gas, a gas that recovers (restores) the surface of the damaged layer using a methyl group (—$CH_3$), which has been used for the recovery processing in the related art to form a dense film on the surface of the porous low-k film (which has been used for a recovery process in the related art), for example, the TMSDMA is used. Accordingly, from the status that the damaged layer as shown in FIG. 4D is formed, when the first processing gas (DMC) and the second processing gas (TMSDMA) are supplied as shown in FIG. 4E, the first processing gas (DMC) permeates inside the damaged layer and the second processing gas (TMSDMA) is reacted on the surface of the damaged layer. Therefore, as shown in FIG. 4F, the first processing gas fixes the moisture in the damaged layer and forms a dehydrated product to remove the moisture. The second processing gas forms a hydrophobic dense reformed layer on the surface of the damaged layer. On this account, the damage on the surface of the damaged layer is recovered so that the k value (specific permittivity) or leakage current value is lowered. Simultaneously, due to the hydrophobic dense reformed layer, new moisture cannot enter into the film so that the moisture in the porous low-k film is maintained low, and oxidation of the barrier metal or wiring lines due to the moisture of the low-k film may be prevented.

In the related art, since the DMC also has a methyl group, the DMC was expected as a processing gas for the recovering processing. However, being a weak acidic material, the DMC is hardly dissociated so that the reaction with the damaged layer hardly occurs. In the case where the processing is performed only using the DMC and the DMC is taken in the atmosphere, the molecules of the DMC in the damaged layer are exhausted in the atmosphere to return to the state before being processed so that the moisture in the damaged layer is received again.

Similarly to the first exemplary embodiment, in the case where the first processing gas and the second processing gas are simultaneously introduced, the permeation of the first processing gas into the damaged layer and the recovery processing by the second processing gas are simultaneously performed. However, since the recovery processing by the second processing gas is stably performed after the pressure of the chamber becomes a predetermined pressure, the dense reformed layer may be formed by the second processing gas after the first processing gas permeates the damaged layer and the dehydration reaction occurs. However, similarly to the second exemplary embodiment, if the first processing gas and the second processing gas are sequentially introduced, the amount of first processing gas that enters into the damaged layer may increase so that the dehydration effect of the damaged layer may further increase.

<Experiment Result>

Next, the effect of the exemplary embodiments that is confirmed by the experiment will be described below.

First, BD2 was used as the low-k film (k value=2.5), and the layer was damaged by an etching process and an ashing process. Thereafter, a k value, a leakage current value, and an amount of moisture in the film were measured for the case where only the TMSDMA is used to perform the recovery processing at a pressure of 50 Torr according to the method of the related art and for the case where the recovery processing is performed using the DMC as the first processing gas and the TMSDMA as the second processing gas whose volume ratio is 80:20 according to the exemplary embodiments of the present disclosure.

Figure 5:
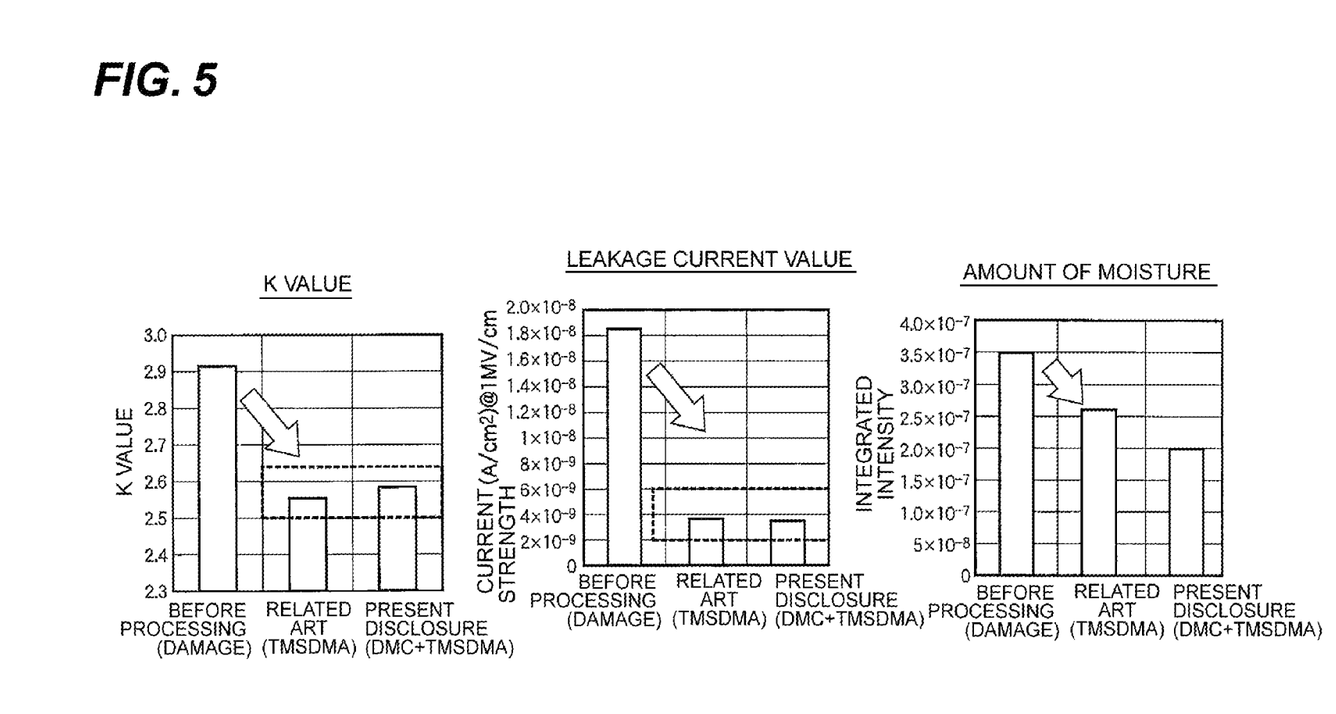
FIG. 5 is a diagram illustrating a result of measuring a k value, a leakage current value, and an amount of moisture in the film when the recovery processing is performed only using TMSDMA in the related art and when the recovery processing is performed using DMC as a first processing gas and TMSDMA as a second processing gas according to an exemplary embodiment of the present disclosure.

The result is shown in FIG. 5. The amount of moisture was measured using FT-IR. As shown in FIG. 5, when using the DMC as the first processing gas and the TMSDMA as the second processing gas according to the exemplary embodiments of the present disclosure, it is confirmed that the amount of moisture in the film can be reduced while maintaining the k value and the leakage current value low as in the related art.

Figure 6:
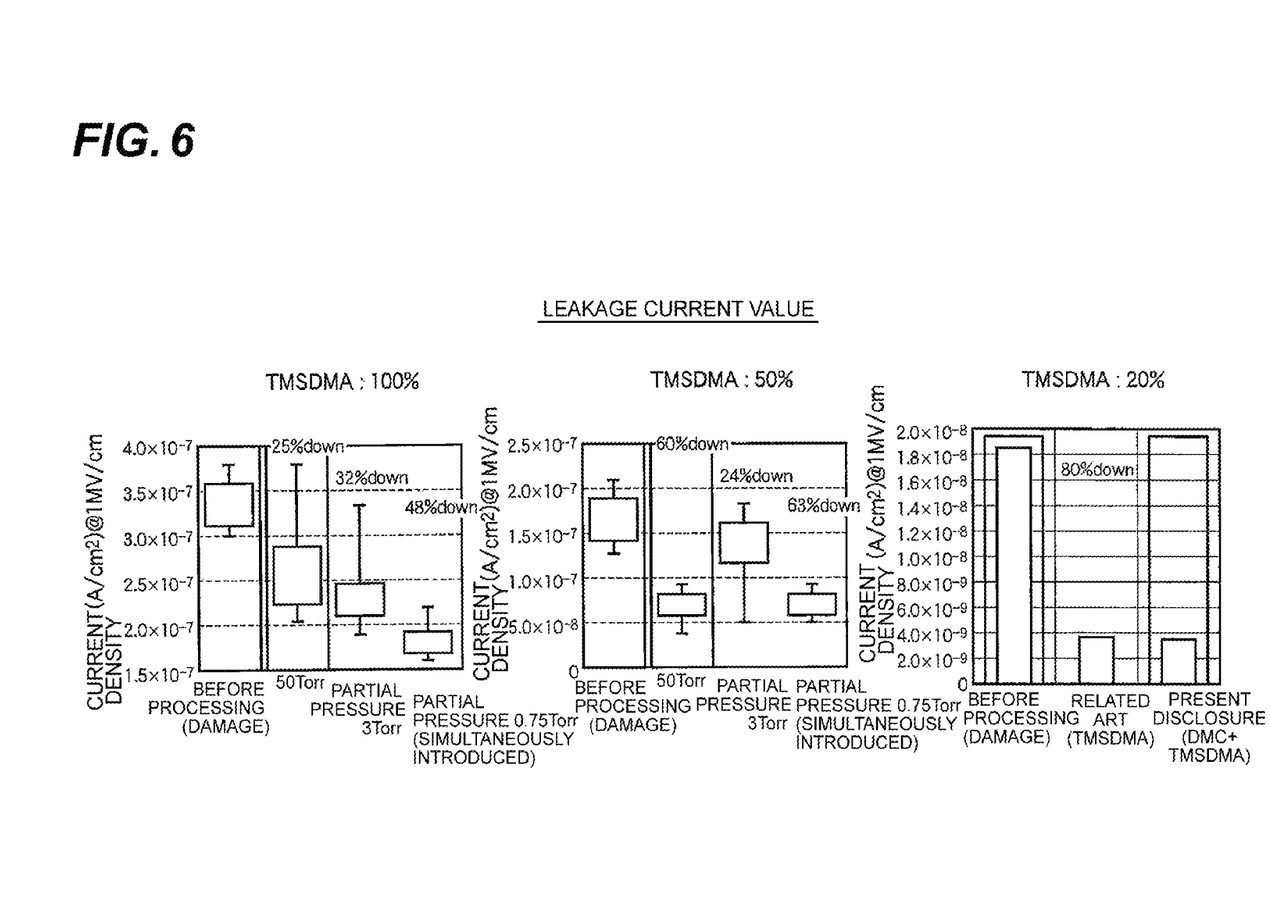
FIG. 6 is a diagram illustrating a result of a leakage current value when the recovery processing is performed by changing the ratio of TMSDMA gas and DMC.

Next, a leakage current value when the recovery processing is performed by changing the ratio of the TMSDMA gas and the DMC is measured. The result is shown in FIG. 6. As shown in FIG. 6, it is understood that the leakage current is correspondingly lowered as the concentration of the TMSDMA which is the second processing gas is lowered. This is estimated that the concentration of the DMC which is the first processing gas is increased so that more moisture in the film is removed by the dehydration effect of the DMC.

If the above-mentioned diazomethane ($CH_2N_2$) is used as the first processing gas, the hydrophobic processing (refers to dehydration processing in a broad sense) is performed into a deep layer that may not be reached by the TMSDMA. Therefore, if combining with diazomethane, the densification by the TMSDMA is available.

<Other Applications>

The present disclosure is not limited to the above exemplary embodiments, but may be variously modified. For example, in the above exemplary embodiments, the DMC is used as the first processing gas and the TMSDMA is used as the second processing gas, but the present disclosure is not limited thereto and other gases may be used as long as they have the same function. The porous low-k film applied to the present disclosure is not limited to the above examples, but any film may be applied as long as the film is damaged and has an —OH group. In the above exemplary embodiments, the chamber is completely sealed during the recovering processing, but the recovery processing may be performed while controlling the pressure using an automatic pressure control valve.

In the above exemplary embodiment, a semiconductor wafer is used as a target substrate. However, the disclosure is not limited thereto, but a substrate for a flat panel display (FPD) or other substrates may be used as well.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A processing method for performing a recovery processing on a damaged layer of a low permittivity film that is formed on a substrate to be processed and has a plurality of pores inside the damaged layer, the method comprising:

applying, on the damaged layer of the low permittivity film formed on the substrate disposed in a processing chamber, a first processing gas containing dimethyl carbonate (DMC) and having molecules smaller than the pores inside the damaged layer to permeate the inside of the damaged layer of the low permittivity film such that the first processing gas causes a dehydration reaction in the plurality of pores inside the damaged layer, thereby removing moisture in the plurality of pores inside the damaged layer by forming dehydrated products in the plurality of pores inside the damaged layer with the first processing gas applied in a gas state; and after removing the moisture in the damaged layer by the first processing gas, applying, on the surface of the damaged layer of the low permittivity film, a second processing gas containing a silylating agent such as N-trimethylsilyldimethylamine (TMSDMA) such that the second processing gas reacts with the surface of the damaged layer to form a hydrophobic dense reformed layer only on the surface of the damaged layer with the second processing gas applied in a gas state, thereby recovering the damaged layer.

2. The processing method of claim 1, wherein the first processing gas and the second processing gas are applied to the damaged layer in a mixture state.

3. The processing method of claim 1, wherein the second processing gas contains Si or C, or both Si and C and recovers a surface of the damaged layer using a methyl group.

4. A non-transitory computer-readable recording medium storing a computer executable program that, when executed, causes a computer to control a processing apparatus to perform a processing method for performing a recovery processing on a damaged layer of a low permittivity film that is formed on a substrate to be processed and has a plurality of pores inside the damaged layer, the method comprising:

applying, on the damaged layer of the low permittivity film formed on the substrate disposed in a processing chamber, a first processing gas containing dimethyl carbonate (DMC) and having molecules which are small sufficient to permeate the inside of the damaged layer of the low permittivity film such that the first processing gas causes a dehydration reaction in the plurality of pores inside the damaged layer, thereby removing moistures in the plurality of pores inside the damaged layer by forming dehydrated products in the plurality of pores inside the damaged layer with the first processing gas applied in a gas state; and after removing the moisture in the damaged layer by the first processing gas, applying, on the surface of the damaged layer of the low permittivity film, a second processing gas containing a silylating agent such as N-trimethylsilyldimethylamine (TMSDMA) such that the second processing gas reacts with the surface of the damaged layer to form a hydrophobic dense reformed layer only on the surface of the damaged layer with the second processing gas applied in a gas state, thereby recovering the damaged layer.

5. The processing method of claim 1, wherein each of the first processing gas and the second processing gas is generated from a first chemical liquid and a second chemical liquid, respectively, by a vaporization.

6. The processing method of claim 5, wherein the flow rate of the first processing gas and the second processing gas ranges from 100 sccm to 2,000 sccm.

7. The processing method of claim 1, wherein each of the first processing gas and the second processing gas is supplied simultaneously with a dilution gas.

8. The processing method of claim 1, further comprising, after applying the second processing gas is stopped, maintaining a processing pressure of the processing chamber where the substrate is disposed at a predetermined value for a predetermined time period.

9. The processing method of claim 8, wherein the predetermined value of the processing pressure ranges from 5 Torr to 30 Torr.

10. The processing method of claim 8, wherein the predetermined time period ranges from 10 sec to 420 sec.

11. The processing method of claim 4, wherein each of the first processing gas and the second processing gas is generated from a first chemical liquid and a second chemical liquid, respectively, by a vaporization.

12. The processing method of claim 11, wherein the flow rate of the first processing gas and the second processing gas ranges from 100 sccm to 2,000 sccm.

13. The processing method of claim 4, wherein each of the first processing gas and the second processing gas is supplied simultaneously with a dilution gas.

14. The processing method of claim 4, further comprising, after applying the second processing gas is stopped, maintaining a processing pressure of the processing chamber where the substrate is disposed at a predetermined value for a predetermined time period.

15. The processing method of claim 14, wherein the predetermined value of the processing pressure ranges from 5 Torr to 30 Torr.

16. The processing method of claim 14, wherein the predetermined time period ranges from 10 sec to 420 sec.

* * * * *